(12) United States Patent
Sano et al.

(10) Patent No.: US 7,560,853 B2
(45) Date of Patent: Jul. 14, 2009

(54) THIN FILM PIEZOELECTRIC RESONATOR, METHOD OF MANUFACTURING THE SAME, AND FILTER INCLUDING THE SAME

(75) Inventors: Kenya Sano, Kawasaki (JP); Kazuhiko Itaya, Yokohama (JP); Ryoichi Ohara, Kawasaki (JP); Takashi Kawakubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 11/675,811

(22) Filed: Feb. 16, 2007

(65) Prior Publication Data

US 2007/0194662 A1 Aug. 23, 2007

(30) Foreign Application Priority Data

Feb. 20, 2006 (JP) ............................. 2006-042466

(51) Int. Cl.
*H01L 41/08* (2006.01)
(52) U.S. Cl. ........................................ 310/324; 310/320
(58) Field of Classification Search ................ 310/324, 310/330, 331, 320; 333/187
See application file for complete search history.

(56) References Cited

U.S. PATENT DOCUMENTS

| 7,098,575 | B2 * | 8/2006 | Mehta | 310/324 |
|---|---|---|---|---|
| 7,205,702 | B2 * | 4/2007 | Ha et al. | 310/320 |
| 7,342,351 | B2 * | 3/2008 | Kubo et al. | 310/344 |
| 2005/0184627 | A1 | 8/2005 | Sano et al. | |
| 2006/0267711 | A1 | 11/2006 | Yanase et al. | |

FOREIGN PATENT DOCUMENTS

| JP | 8-148968 | 6/1996 |
|---|---|---|
| JP | 2002-140075 | 5/2002 |

\* cited by examiner

*Primary Examiner*—Mark Budd
(74) *Attorney, Agent, or Firm*—Oblon, Spivak, McClelland, Maier & Neustadt, P.C.

(57) ABSTRACT

A thin film piezoelectric resonator includes: a substrate having a cavity; a first dielectric layer provided on the substrate to cover the cavity; a second dielectric layer provided on the substrate and disposed in a peripheral region of the cavity, and having a thickness larger than the first dielectric layer; a first electrode provided on the first dielectric layer and above the cavity; a piezoelectric layer provided on the first electrode and disposed to extend to a region on the second dielectric layer; and a second electrode provided on the piezoelectric layer and above the first electrode.

14 Claims, 14 Drawing Sheets

THIN FILM PIEZOELECTRIC RESONATOR, METHOD OF MANUFACTURING THE SAME, AND FILTER INCLUDING THE SAME

CROSS-REFERENCE TO RELATED APPLICATIONS

This application is based upon and claims the benefit of priority from Japanese Patent Application No. 2006-042466, filed on Feb. 20, 2006, the entire contents of which are incorporated herein by reference.

BACKGROUND

1. Field

The present invention relates to a thin film piezoelectric resonator, a method of manufacturing the same, and a filter including the same.

2. Description of the Related Art

Recently, as wireless technologies have been rapidly developed, a method of achieving high-speed transmission of information has been developed. A radio frequency (RF) has been used together with an increase in an amount of transmitted information, and a radio frequency communication apparatus has been required to have a small size and light weight. Generally, a wireless apparatus includes a RF front end unit that processes a radio frequency, and a base band (BB) unit that processes a digital signal. The BB unit performs modulation and demodulation of a signal by a digital signal process. Basically, since the BB unit may be formed by a LSI chip, the BB unit can be easily small-sized. The RF front end unit performs amplifying or frequency conversion on a radio frequency signal as an analog signal. Since it is difficult for the RF front end unit to be constructed by using only an LSI chip, the RF front end unit has a complicated structure which includes a plurality of passive components, such as an oscillator or a filter.

Generally, as RF (radio frequency) and IF (intermediate frequency) filters in a mobile communication apparatus, a surface acoustic wave (SAW) element is generally used. However, a resonance frequency of the SAW element is inversely proportional to the distance between interdigital electrodes, and in a frequency region exceeding a frequency of 1 GHz, the distance between the interdigital electrodes is 1 µm or less. With respect to a high frequency for a used frequency required in recent times, it is difficult to correspond to the used frequency. Since the filter uses a special substrate containing $LiTaO_3$, it is basically an individual component, and it is difficult to reduce a scale of the filter.

Instead of the SAW element, as a resonator that has been attracted attention in recent times, there is a thin film piezoelectric resonator that uses a longitudinal vibration of a piezoelectric thin film in a thickness direction. The thin film piezoelectric resonator is called a bulk acoustic wave (BAW) element. In the thin film piezoelectric resonator, a resonance frequency is determined by the velocity of sound and the thickness of a piezoelectric film. Generally, the resonance frequency corresponds to 2 GHz at a thickness of 1 to 2 µm, and corresponds to 5 GHz at a thickness of 0.4 to 0.8 µm. That is, the resonance frequency may rise to several tens of giga hertz. Further, the thin film piezoelectric resonator can be easily formed on a Si substrate, and has an advantage in the requirement of downsizing.

In order to operate the thin film piezoelectric resonator, it is preferable for the thin film piezoelectric resonator to have a structure in which a peripheral portion of a piezoelectric thin film is fixed and a central portion thereof freely vibrates. For this reason, a method of forming a thin film piezoelectric resonator having a following structure has been suggested (for example, JP-A 8-148968 (KOKAI)). According to this method, in the thin film piezoelectric resonator, a lower electrode, a piezoelectric layer, and an upper electrode are sequentially deposited on a silicon substrate, an upper surface of the piezoelectric layer contacts the air through the upper electrode, and a lower surface of the piezoelectric layer contacts the air through the lower electrode, and a cavity is provided below the lower electrode, or a cavity for exposing the lower electrode is provided at the substrate.

Further, in order to obtain a sound resonator which is robust and has a large Q value, a method of manufacturing a thin film piezoelectric resonator has been suggested in which a depression is formed in a substrate by etching, a sacrificial material is filled into the depression, a conductive layer and an electrode layer are deposited, and the sacrificial material is removed from the depression (for example, JP-A 2002-140075 (KOKAI)).

For example, as disclosed JP-A 8-148968 (KOKAI), when forming the cavity passing through the substrate, it is required for the substrate to be etched from a rear surface of the substrate. The etching of the substrate from the rear surface is performed by means of wet etching using a drug solution and dry etching using fluorine based gas. In the wet etching, an alkali liquid, such as potassium hydroxide (KOH) to be an anisotropic etching liquid of silicon, or tetramethylammonium hydroxide (TMAH), is used. In the dry etching, a fluorine based gas, such as $C_4F_8$, $CF_4$, or the like, is mainly used. When the cavity is formed by means of the above-described etching, if considering a processing margin or stability at the time of mass production, it is required to provide below the lower electrode a stopper layer (hereinafter, referred to as dielectric layer) that can sufficiently ensure Si, such as $SiO_2$ or $Si_3N_4$, and etching selectivity. However, considering etching selectivity in etching the rear surface of the silicon substrate, if the dielectric layer is formed to have a large thickness, when the dielectric layer finally remains below the lower electrode, the slight reduction of the film thickness occurs due to the etching from the rear surface of the substrate, and the variation occurs in the resonator characteristic. Further, when the dielectric layer is removed, since the film thickness of the dielectric layer is large, an etching time necessary for each etching is increased, which results in lowering the throughput.

Meanwhile, in a case in which thickness of the dielectric layer is small, a possibility becomes high in which the dielectric layer is also etched due to etching performed when forming a lower electrode, a piezoelectric layer, and an upper electrode on the surface side of the substrate, in particular, when forming the piezoelectric layer, and thus the substrate is exposed to the outside. When the substrate is exposed, mutual diffusion with metals, such as the upper electrode, a bonding pad, and the like, or a silicide reaction occurs, which causes an increase in resistance.

SUMMARY

According to a first aspect of the invention, a thin film piezoelectric resonator includes: a substrate having a cavity; a first dielectric layer provided on the substrate to cover the cavity; a second dielectric layer provided on the substrate and disposed in a peripheral region of the cavity, and having a thickness larger than the first dielectric layer; a first electrode provided on the first dielectric layer and above the cavity; a piezoelectric layer provided on the first electrode and disposed to extend to a region on the second dielectric layer; and a second electrode provided on the piezoelectric layer and above the first electrode.

According to a second aspect of the invention, a thin film piezoelectric resonator includes: a substrate having a cavity; a first dielectric layer provided on the substrate to cover the cavity; a first electrode provided on the first dielectric layer and above the cavity; a piezoelectric layer provided on the first electrode; a second electrode provided on the piezoelectric layer and above the first electrode; and a second dielectric layer provided between the substrate and the first dielectric layer in a peripheral region of an excitation portion including an overlapping region of the cavity, the first electrode, the piezoelectric layer, and the second electrode, wherein the piezoelectric layer is disposed on the first dielectric layer and extends to a region on at least a part of the second dielectric layer.

According to a third aspect of the invention, a filter includes: a substrate including a plurality of cavities disposed to be spaced apart from one another; a first dielectric layer provided on the substrate to cover the plurality of cavities; a second dielectric layer provided on the substrate and disposed in peripheral regions of the plurality of cavities, and having a thickness larger than the first dielectric layer; a plurality of first electrodes provided on the first dielectric layer and above the plurality of cavities, respectively; a piezoelectric layer provided on the plurality of first electrodes and disposed to extend to a region on at least a part of the second dielectric layer; and a plurality of second electrodes provided on the piezoelectric layer and above the plurality of first electrodes, respectively.

According to a fourth aspect of the invention, a filter includes: a substrate including a plurality of cavities disposed to be spaced apart from one another; a first dielectric layer provided on the substrate to cover the plurality of cavities; a plurality of first electrodes provided on the first dielectric layer and above the plurality of cavities, respectively; a piezoelectric layer provided on the plurality of first electrodes; a plurality of second electrodes provided on the piezoelectric layer and above the plurality of first electrodes, respectively; and a second dielectric layer provided between the substrate and the first dielectric layer in peripheral regions of a plurality of excitation portions, each of which includes an overlapping region of the cavity, the first electrode, the piezoelectric layer, and the second electrode, wherein the piezoelectric layer is disposed on the first dielectric layer and extends to a region on at least a part of the second dielectric layer.

According to a fifth aspect of the invention, a method of manufacturing a thin film piezoelectric resonator includes: forming a first dielectric layer on a substrate at a region where an excitation portion is disposed; forming a second dielectric layer having a larger thickness than the first dielectric layer in a peripheral region of the first dielectric layer; forming a first electrode on the first dielectric layer; forming a piezoelectric layer on the first electrode to extend to a region on at least a part of the second dielectric layer; forming a second electrode on the piezoelectric layer and above the first electrode; and forming a cavity passing through the substrate below at least a part of a region overlapping the first electrode, the piezoelectric layer and the second electrode.

According to a sixth aspect of the invention, a method of manufacturing a thin film piezoelectric resonator includes: forming a second dielectric layer on a substrate at a region where an excitation portion is disposed and in peripheral regions of the location; forming a first dielectric layer on the substrate including the second dielectric layer; forming a first electrode on the first dielectric layer and above the second dielectric layer on which the excitation portion is disposed; forming a piezoelectric layer on the first dielectric layer and above the first electrode to extend to a region on at least a part of the second dielectric layer; forming a second electrode on the piezoelectric layer and above the first electrode; and forming a cavity passing through the substrate below at least a part of a region overlapping the first electrode, the piezoelectric layer and the second electrode.

DETAILED DESCRIPTION

Figure 1:
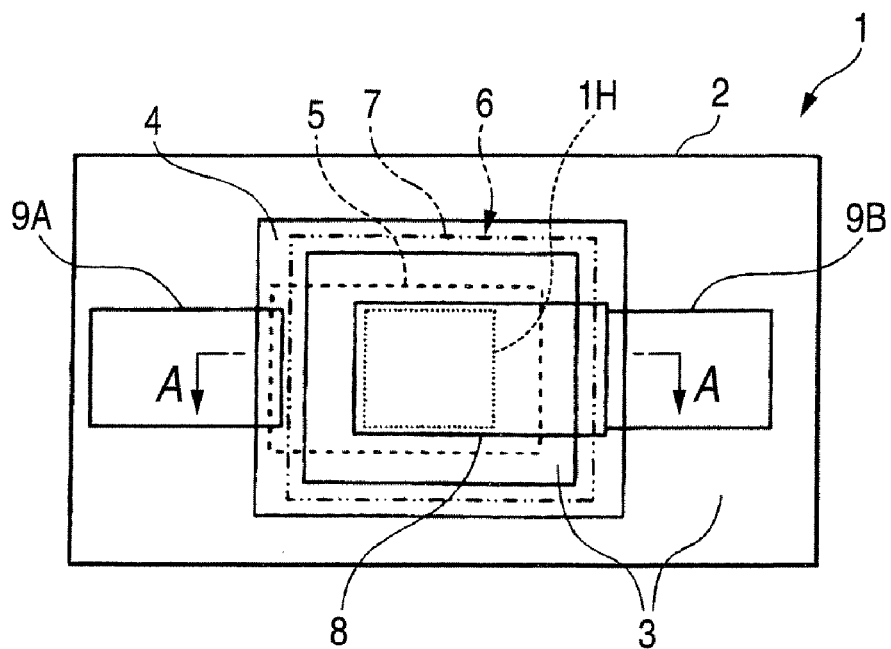
FIG. 1 is a plan view of a thin film piezoelectric resonator according to a first embodiment of the invention.

Hereinafter, the preferred embodiments of the invention will be described with reference to the accompanying drawings. Like numerals refer to like elements throughout the specification. However, it should be understood that the drawings are only schematic, and a relationship between a thickness and a size of each layer or member, or the scale of each layer or member has been adjusted in order to have a recognizable size in the drawings. Accordingly, a specific thickness or size can be determined with reference to the following description. Further, in the respective drawings, a relationship between a thickness and a size of each layer or member, or the scale of each layer or member is different.

As a resonance characteristic of a thin film piezoelectric resonator, there are an electromechanical coupling coefficient $K_t^2$ indicating the intensity of piezoelectricity, and a Q value indicating resonance sharpness. Further, the Q value includes a Q value at a resonance point where electrical impedance becomes very small, and a Q value at an antiresonance point where electrical impedance becomes very large. When resonators are combined to form a filter, a bandwidth of the filter is proportional to an electromechanical coupling coefficient $K_t^2$, and insertion loss in a band is inversely proportional to a performance index represented by multiplying the electromechanical coupling coefficient $K_t^2$ by the Q value. The electromechanical coupling coefficient $K_t^2$ is a characteristic value of a material. In the case in which the purity of crystals is increased and crystal orientation in a polarizing direction is controlled, thereby achieving a desired bandwidth, the electromechanical coupling coefficient $K_t^2$ does not need to be further increased. Accordingly, the Q value needs to be increased by an amount capable of reducing insertion loss. Factors that affect the Q value at the resonance point include elastic loss of a piezoelectric substance, elastic loss of an electrode, and series resistance of the electrode. Meanwhile, factors that affect the Q value at the antiresonance point include elastic loss of a piezoelectric substance, elastic loss of an electrode, capacitance of the substrate, and dielectric loss of the piezoelectric substance. According to analyzing of experimental data by the inventors, the Q value at the resonance point is largely affected by the series resistance of the lower electrode, and the Q value at the antiresonance point is largely affected by the elastic loss of the piezoelectric substance. From this examination, it has been determined that if the series resistance of the electrode is increased due to the etching failure, the Q value at the resonance point is lowered, which affects the characteristics of the thin film piezoelectric resonator.

FIRST EMBODIMENT (Thin Film Piezoelectric Resonator)

A thin film piezoelectric resonator 1 according to a first embodiment of the invention will be described with reference to FIGS. 1 to 9.

Figure 2:
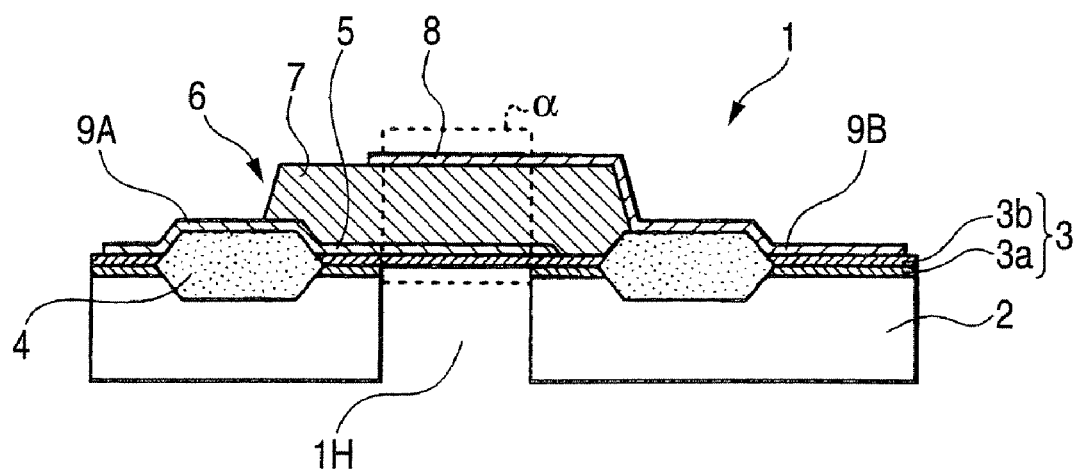
FIG. 2 is a cross-sectional view taken along the line A-A of FIG. 1.

As shown in FIGS. 1 and 2, the thin film piezoelectric resonator 1 includes a substrate 2 having a cavity 1H, a first dielectric layer 3 provided on the substrate 2 to cover the cavity 1H, a second dielectric layer 4 provided on the substrate 2 and disposed in a peripheral region of the cavity 1H, a first electrode 5 (lower electrode) provided on the first dielectric layer 3 and above the cavity 1H, a piezoelectric layer 7 provided on the first electrode 5 and disposed to extend to a region on at least a part of an upper surface of the second dielectric layer 4, and a second electrode 8 (upper electrode) disposed on the piezoelectric layer 7 and above the first electrode 5. The second dielectric layer 4 has a larger thickness than the first dielectric layer 3, and an upper surface of the second dielectric layer 4 protrudes from the surface of the substrate 2. In addition, the second dielectric layer 4 is disposed within a restricted region in the peripheral region of the cavity 1H.

As the substrate 2, for example, a silicon (Si) substrate is practically used. The cavity 1H is formed by a hole that passes through the substrate 2 in the same planar shape from a front surface of the substrate 2 to a rear surface thereof. Further, a region occupied by the cavity 1H is accommodated in a region occupied by the first electrode 5. However, if the first substrate 5 may be held on the substrate 2, the region occupied by the cavity 1H may extend to the outside of the first electrode 5.

For example, the first dielectric layer 3 includes a laminated structure in which dielectric layers 3a and 3b having different materials are laminated. However, the laminated structure of the first dielectric layer 3 is not limited thereto, and may include only a dielectric layer of a single layer. If considering a processing margin and stability at the time of mass production, the first dielectric layer 3 is preferably formed of a silicon oxide film or a silicon nitride film. However, if having a dielectric characteristic, the forming material of the first dielectric layer 3 is not limited thereto, and the first dielectric layer 3 may be formed of an aluminum nitride film.

The second dielectric layer 4 is provided on the substrate 2 and disposed in the peripheral region of the cavity 1H. Here, the peripheral regions refer to regions disposed in the vicinity of an excitation portion at a predetermined gap from the excitation portion. The excitation portion is constructed at a bridge portion of an overlapping region α of the cavity 1H, the first electrode 5, the piezoelectric layer 7, and the second electrode 8. Further, the second dielectric layer 4 has a larger thickness than the first dielectric layer 3. The second dielectric layer 4 may be formed of the same material as the first dielectric layer 3.

The first electrode 5 is disposed on the first dielectric layer 3 and above the cavity 1H, and the region α of the first electrode 5 overlapping the cavity 1H is used as an effective lower electrode. A portion, which is formed of the same layer as the first electrode 5, integrated with the first electrode 5 (electrically connected to the first electrode 5), and provided in a region that does not overlap the cavity 1H, is used as a leading wiring line 9A. Each of the first electrode 5 and the leading wiring line 9A is formed by using, for example, a metal film, such as aluminum (Al), an aluminum alloy, or the like, as a main body, and has a double structure in which a lower side of the piezoelectric layer 7 is an amorphous structure, in order to improve orientation of the piezoelectric layer 7.

The piezoelectric layer 7 is provided on the first electrode 5 to overlap the cavity 1H, and extends to a region on at least a part of the upper surface of the second dielectric layer 4. That is, an edge portion 6 of the piezoelectric layer 7 is disposed on the second dielectric layer 4. Further, the edge portion 6 of the piezoelectric layer 7 indicates a processed end etched by patterning, in a case in which after a film containing, for example, aluminum nitride (AlN) is formed on the substrate 2 including the upper surface of the first electrode 5, the film is patterned in a predetermined shape to form the piezoelectric layer 7.

The second electrode 8 is disposed on the piezoelectric layer 7 and above the first electrode 5, and the region α of the second electrode 8 that overlaps the cavity 1H is used as an effective upper electrode. A portion, which is formed of the same layer as the second electrode 8, integrated with the second electrode 8 (electrically connected to the second electrode 8), and provided in a region that does not overlap the cavity 1H, is used as a leading wiring line 9B. Each of the second electrode 8 and the leading wiring line 9B can be formed by using molybdenum (Mo).

In the thin film piezoelectric resonator 1, the above-described excitation portion can vibrate by applying a voltage between the first electrode 5 and the second electrode 8, thus obtaining a resonance characteristic as the thin film piezoelectric resonator 1.

Next, a method of manufacturing the thin film piezoelectric resonator 1 will be described with reference to FIGS. 3 to 9. Each of the cross-sectional views shown in FIGS. 3 to 9 corresponds to a cross-sectional view taken along the line A-A of FIG. 1.

Figure 3:
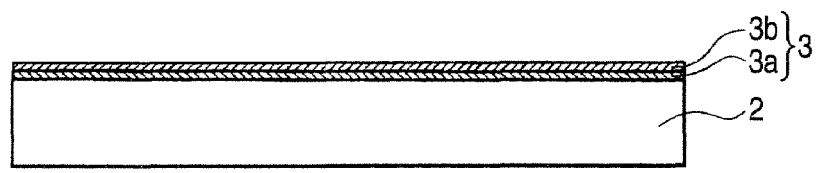
FIG. 3 is a schematic cross-sectional view illustrating a process of a method of manufacturing the thin film piezoelectric resonator according to the first embodiment.
Figure 4:
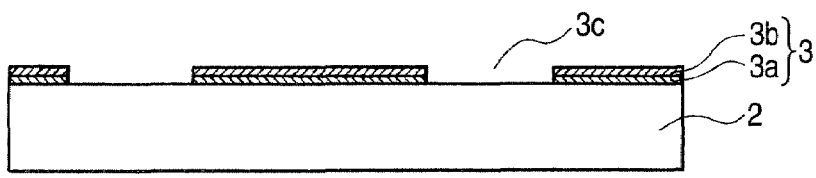
FIG. 4 is a schematic cross-sectional view illustrating a process of the method of manufacturing the thin film piezoelectric resonator according to the first embodiment.

First, as the first dielectric layer 3, a laminator obtained by laminating a $SiO_2$ film 3a and a $Si_3N_4$ film 3b respectively with a thickness of 50 nm by means of a thermal oxidation method, is formed on the substrate 2 formed of, for example, silicon (Si) (see FIG. 3).

Then, a patterning process is performed on the formed first dielectric layer 3 by means of known photolithography or reactive ion etching (RIE). Then, openings 3c for exposing the surface of the substrate 2 are formed in a peripheral region of the first dielectric layer 3 where the region the excitation portion is formed (see FIG. 4).

Figure 5:
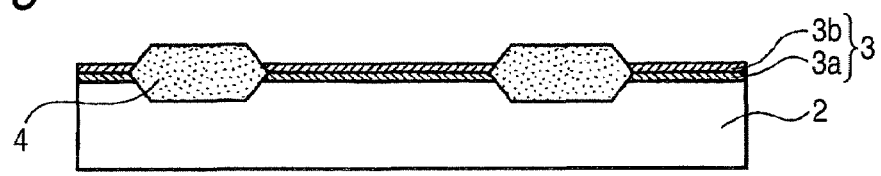
FIG. 5 is a schematic cross-sectional view illustrating a process of the method of manufacturing the thin film piezoelectric resonator according to the first embodiment.
Figure 6:
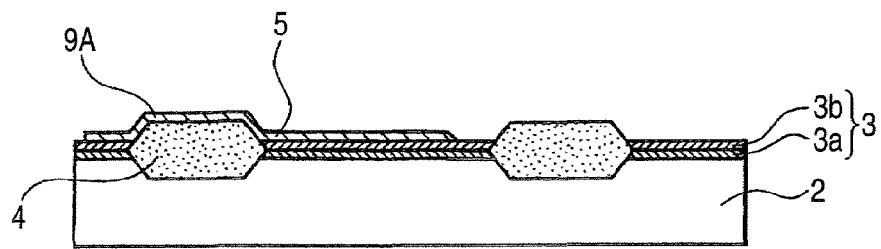
FIG. 6 is a schematic cross-sectional view illustrating a process of the method of manufacturing the thin film piezoelectric resonator according to the first embodiment.

Then, by means of dry oxidation, a $SiO_2$ film serving as the second dielectric layer 4 is deposited with a thickness of 150 nm in the openings 3c, thereby forming the second dielectric layer 4 (see FIG. 5).

Then, by means of a RF magnetron sputtering method, a metal film containing an amorphous Ta—Al alloy and Ni is deposited on the first dielectric layer 3 and the second dielectric layer 4. Then, the metal film is subjected to a patterning process by means of known photolithography and reactive ion etching (RIE), thereby forming the first electrode 5 and the leading wiring line 9A (see FIG. 6). Specifically, the patterning process of the metal film containing the amorphous Ta—Al alloy and Ni may be selectively performed by means of the RIE using a fluorine gas, such as $C_4F_8$ or the like, as an etching gas.

Figure 7:
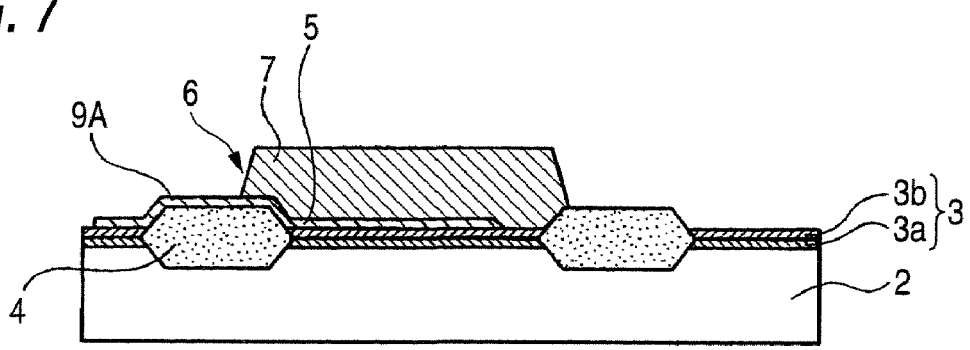
FIG. 7 is a schematic cross-sectional view illustrating a process of the method of manufacturing the thin film piezoelectric resonator according to the first embodiment.

Then, a metal film containing AlN is deposited on the substrate 2 including the first electrode 5 by means of a RF magnetron sputtering method, and subjected to a patterning process by means of known photolithography and reactive ion etching (RIE), thereby forming the piezoelectric layer 7 on the first electrode 5 to extend to a region on at least a part of the second dielectric layer 4 (see FIG. 7). The thickness of the piezoelectric layer 7 depends on a resonance frequency. If the piezoelectric layer 7 is containing AlN and the resonance frequency is about 1.9 GHz, the thickness of the piezoelectric layer 7 may be about 2.2 μm.

Figure 8:
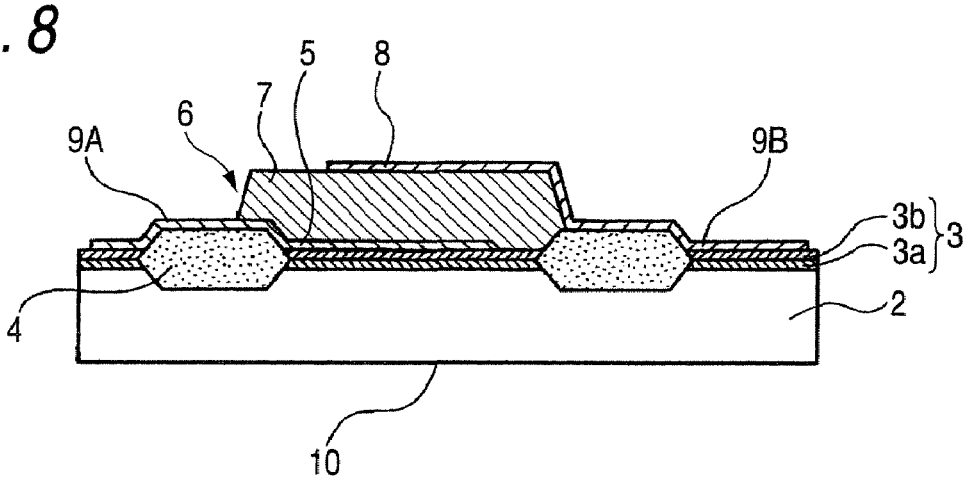
FIG. 8 is a schematic cross-sectional view illustrating a process of the method of manufacturing the thin film piezoelectric resonator according to the first embodiment.
Figure 9:
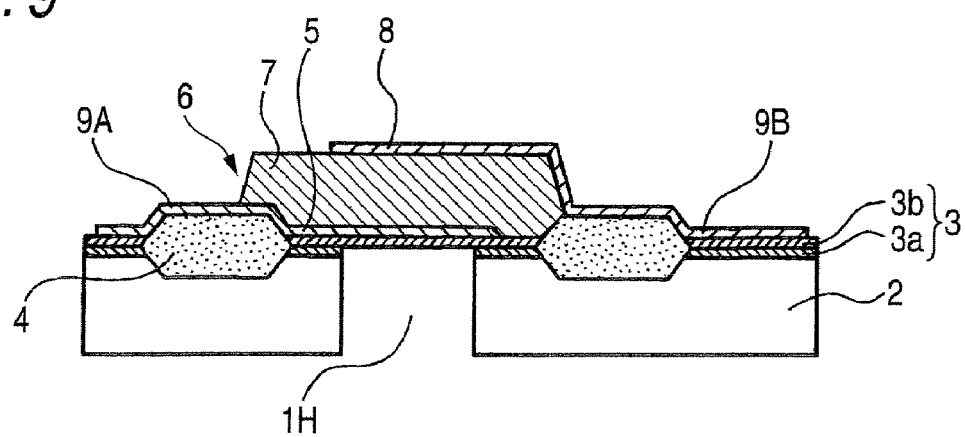
FIG. 9 is a schematic cross-sectional view illustrating a process of the method of manufacturing the thin film piezoelectric resonator according to the first embodiment.
Figure 10:
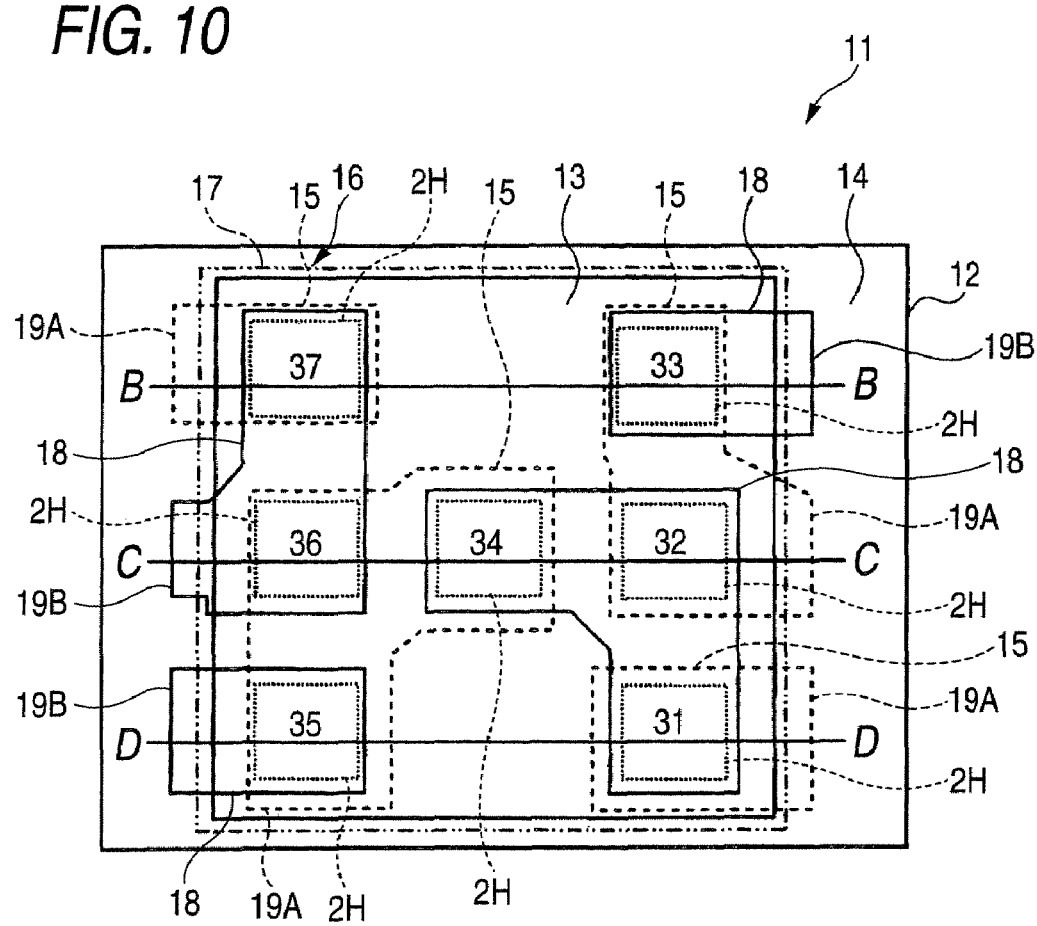
FIG. 10 is a plan view of a filter according to the first embodiment.
Figure 11:
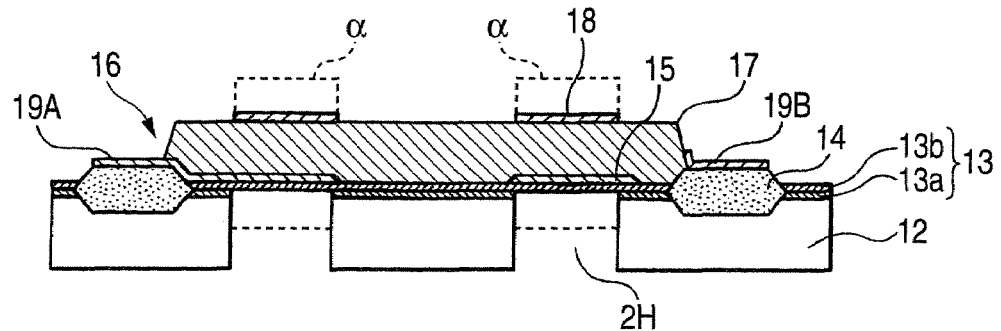
FIG. 11 is a cross-sectional view taken along the line B-B of FIG. 10.
Figure 12:
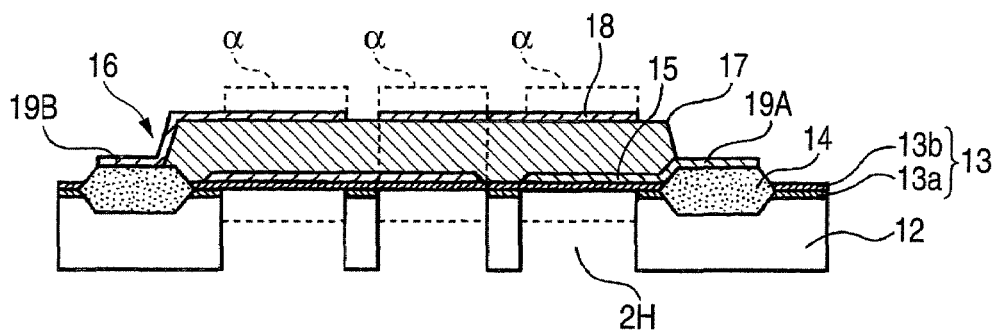
FIG. 12 is a cross-sectional view taken along the line C-C of FIG. 10.
Figure 13:
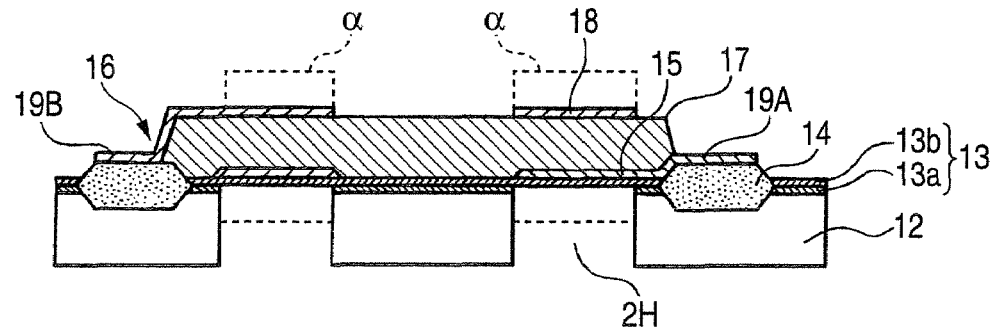
FIG. 13 is a cross-sectional view taken along the line D-D of FIG. 10.

Then, a metal film containing Ni is deposited on the substrate 2 including the piezoelectric layer 7 and then subjected to a patterning process by means of known photolithography and reactive ion etching (RIE), thereby forming the second electrode 8 on the piezoelectric layer 7 and above the first electrode 5, and forming the leading wiring line 9B electrically connected to the second electrode 8 (see FIG. 8).

Further, an etching process is performed from the rear surface side 10 of the substrate 2 by means of Deep-RIE using a fluorine gas, and the cavity 1H having a sectional shape of a vertical side wall is formed in the substrate 2 below at least a part of a region overlapping the first electrode 5, the piezoelectric layer 7 and the second electrode 8. Then, the $SiO_2$ film 3a that corresponds to the lower layer of the first dielectric layer 3 remaining on the cavity 1H is removed by means of wet etching and reactive ion etching using an arsenide based gas, thereby completing the thin film piezoelectric resonator 1 according to the first embodiment (see FIG. 9).

As the result of evaluating the resonance characteristic of the thin film piezoelectric resonator formed by the above-described method by a vector network analyzer (HP8510C), excellent characteristics are obtained as follows. The resonance frequency is 2.0 GHz, an electromechanical coupling coefficient $K_r^2$ is 6.5%, and a Q value is 1000 at a resonance point while being 900 at an antiresonance point.

As such, in the thin film piezoelectric resonator 1 according to the first embodiment, the first dielectric layer 3 located below the first electrode 5 is formed to have the minimum necessary thickness, and the second dielectric layer 4 located below the edge portion 6 of the piezoelectric layer 7 is formed to have a larger thickness than the first dielectric layer 3. Therefore, at the time of forming the cavity 1H that passes through the substrate 2, it is possible to suppress the reduction of the film thickness occurring due to the large thickness of the dielectric layer located below the first electrode 5 and the reduction of the throughput occurring due to the increase of the etching time. Further, at the time of forming the piezoelectric layer 7, since it is possible to prevent the exposure of the surface of the substrate occurring due to the small thickness of the dielectric layer, a thin film piezoelectric resonator having high performance can be manufactured with high productivity.

(Filter)

Next, a filter according to the first embodiment of the invention will be described with reference to FIGS. 10 to 20. The thin film piezoelectric resonator according to the first embodiment of the invention is applied to the filter according to the first embodiment of the invention.

As shown in FIGS. 10 to 13, the filter 11 includes a substrate 12 having a plurality of cavities 2H disposed to be spaced apart from each other, a first dielectric layer 13 provided on the substrate 12 to cover the cavities 2H, a second dielectric layer 14 provided on the substrate 12 and disposed in peripheral regions of the plurality of cavities 2H, a plurality of first electrodes 15 (lower electrodes) provided on the first dielectric layer 13 and above the plurality of cavities 2H, respectively, a piezoelectric layer 17 provided on the plurality of first electrodes 15 and extends to a region on at least a part of the second dielectric layer 14, and a plurality of second electrodes 18 (upper electrodes) provided on the piezoelectric layer 17 and above the first electrodes 15, respectively. The second dielectric layer 14 has a larger thickness than the first dielectric layer 13, and an upper surface of the second dielectric layer 4 protrudes from the surface of the substrate 2.

As the substrate 12, for example, a silicon (Si) substrate is practically used. Each of the plurality of cavities 2H is formed by a hole that passes through the substrate 12 in the same planar shape from a front surface of the substrate 12 to a rear surface thereof. Further, a region occupied by the cavity 2H is accommodated in a region occupied by the first electrode 15. However, if the first electrode 15 may be held on the substrate 12, the region occupied by the cavity 2H may extend to the outside of the first electrode 15.

For example, the first dielectric layer 13 includes a laminated structure in which a plurality of dielectric layers 13a and 13b having different materials are laminated. However, the laminated structure of the first dielectric layer 13 is not limited thereto, and may include only a dielectric layer of a single layer. If considering a processing margin and stability at the time of mass production, the first dielectric layer 13 is preferably formed of a silicon oxide film or a silicon nitride film. However, if having a dielectric characteristic, the forming material of the first dielectric layer 13 is not limited thereto, and the first dielectric layer 13 may be formed of an aluminum nitride film.

The second dielectric layer 14 is provided on the substrate 12 and disposed in the peripheral regions of the plurality of cavities 2H. In this case, the peripheral regions refer to regions disposed in the vicinity of a plurality of thin film piezoelectric resonators 31 to 37 having excitation portions at a predetermined gap from the plurality of thin film piezoelectric resonators. The excitation portion is constructed at a bridge portion of an overlapping region α of the cavity 2H, the first electrode 15, the piezoelectric layer 17, and the second electrode 18. Further, the second dielectric layer 14 has a larger thickness than the first dielectric layer 13. The second dielectric layer 14 may be formed of the same material as the first dielectric layer 13.

The first electrode 15 is disposed on the first dielectric layer 13 and above the cavity 2H, and the region a of the first electrode 15 that overlaps the cavity 2H is used as an effective lower electrode. A portion, which is formed of the same layer as the first electrode 15, integrated with the first electrode 15 (electrically connected to the first electrode 15), and provided in a region that does not overlap the cavity 2H, is used as a leading wiring line 19A. Each of the first electrode 15 and the leading wiring line 19A is formed by using, for example, a metal film containing aluminum (Al), an aluminum alloy, or the like, as a main body, and has a double structure in which a lower side of the piezoelectric layer 17 is an amorphous structure, in order to improve orientation of the piezoelectric layer 17.

The piezoelectric layer 17 is provided on the first electrode 15 to overlap the cavity 2H, and extends to a region on at least a part of the second dielectric layer 14. That is, an edge portion 16 of the piezoelectric layer 17 is disposed on the second dielectric layer 14. In this case, the edge portion 16 of the piezoelectric layer 17 indicates a processed end etched by patterning, in a case in which after a film containing, for example, aluminum nitride (AlN) is formed on the substrate 12 including the region on the first electrode 15, the film is patterned in a predetermined shape to form the piezoelectric layer 17.

The second electrode 18 is disposed on the piezoelectric layer 17 and above the first electrode 15, and the region α of the second electrode 18 that overlaps the cavity 2H is used as an effective upper electrode. A portion, which is formed of the same layer as the second electrode 18, integrated with the second electrode 18 (electrically connected to the second electrode 18), and provided in a region that does not overlap the cavity 2H, is used as a leading wiring line 19B. Each of the second electrode 18 and the leading wiring line 19B can be formed by using molybdenum (Mo).

In the filter 11, the plurality of thin film piezoelectric resonators 31 to 37 can vibrate by applying a voltage between the first electrodes 15 and the second electrodes 18, thereby obtaining resonance characteristics as the filter 11.

Figure 14:
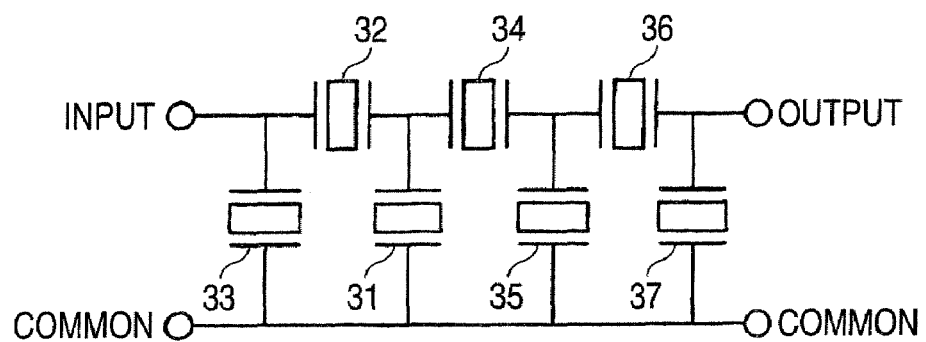
FIG. 14 is a diagram illustrating a circuit structure of the filter according to the first embodiment.

As shown in FIG. 14, the filter 11 has a structure in which three thin film piezoelectric resonators 32, 34, and 36 are electrically connected in series to one another, and four thin film piezoelectric resonators 31, 33, 35, and 37 are electrically connected parallel to one another. That is, the filter 11 includes the seven thin film piezoelectric resonators 31 to 37.

Next, a method of manufacturing the filter 11 will be described with reference to FIGS. 15 to 20. Each of the cross-sectional views shown in FIGS. 15 to 20 corresponds to a cross-sectional view taken along the line C-C of FIG. 10.

Figure 15:
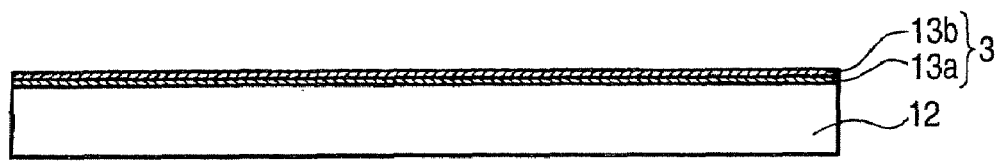
FIG. 15 is a schematic cross-sectional view illustrating a process of a method of manufacturing the filter according to the first embodiment.
Figure 16:
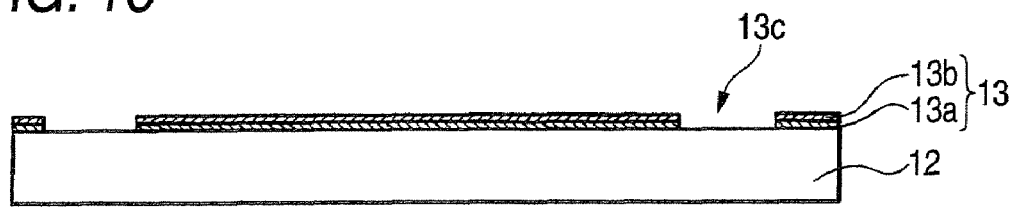
FIG. 16 is a schematic cross-sectional view illustrating a process of the method of manufacturing the filter according to the first embodiment.

First, as the first dielectric layer 13, a laminator, which is obtained by laminating a $SiO_2$ film 13a and a $Si_3N_4$ film 13b respectively with a thickness of 50 nm by means of a thermal oxidation method, is formed on the substrate 12 formed of, for example, silicon (Si) (see FIG. 15). Then, a patterning process is performed on the formed first dielectric layer 13 by means of known photolithography or reactive ion etching (RIE). Then, openings 13c for exposing the surface of the substrate 12 are formed in a peripheral region of the first dielectric layer 13 where the excitation portion is formed (see FIG. 16).

Figure 17:
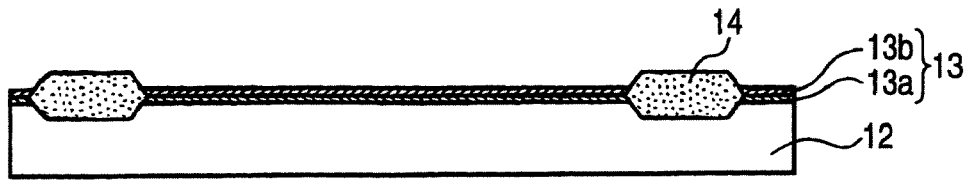
FIG. 17 is a schematic cross-sectional view illustrating a process of the method of manufacturing the filter according to the first embodiment.
Figure 18:
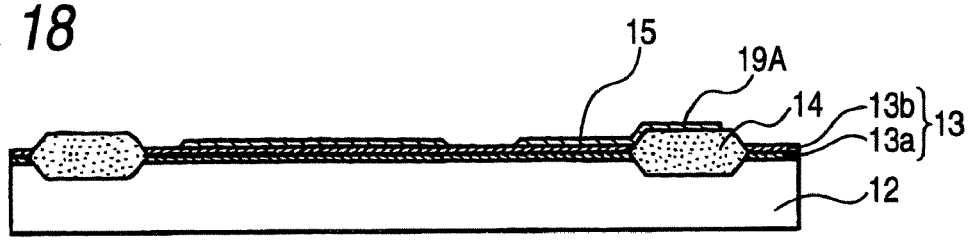
FIG. 18 is a schematic cross-sectional view illustrating a process of the method of manufacturing the filter according to the first embodiment.

Then, by means of dry oxidation, a $SiO_2$ film serving as the second dielectric layer 14 is deposited with a thickness of 150 nm in the openings 13c, thereby forming the second dielectric layer 14 (see FIG. 17).

Then, by means of a RF magnetron sputtering method, a metal film containing an amorphous Ta—Al alloy and Ni is deposited on the first dielectric layer 13 and the second dielectric layer 14. Then, the metal film is subjected to a patterning process by means of known photolithography and reactive ion etching (RIE), thereby forming the first electrode 15 and the leading wiring line 19A at a predetermined location for forming the excitation portion (see FIG. 18). Specifically, the patterning process of the metal film containing the amorphous Ta—Al alloy and Ni may be selectively performed by means of the RIE using a fluorine gas, such as $C_4F_8$ or the like, as an etching gas.

Figure 19:
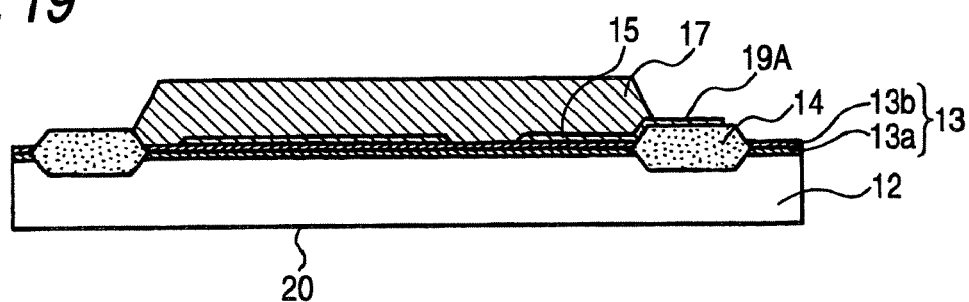
FIG. 19 is a schematic cross-sectional view illustrating a process of the method of manufacturing the filter according to the first embodiment.
Figure 20:
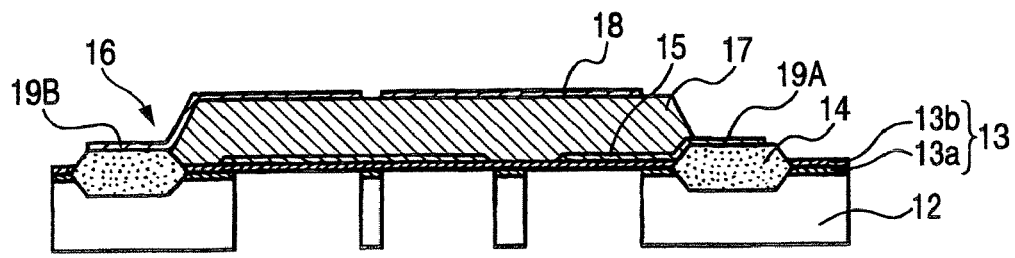
FIG. 20 is a schematic cross-sectional view illustrating a process of the method of manufacturing the filter according to the first embodiment.

Then, a metal film containing AlN is deposited on the substrate 12 including the first electrode 15 by means of a RF magnetron sputtering method, and subjected to a patterning process by means of known photolithography and reactive ion etching (RIE), thereby forming the piezoelectric layer 17 on the first electrode 15 to extend to a region on at least a part of the second dielectric layer 14 (see FIG. 19). The thickness of the piezoelectric layer 17 depends on a resonance frequency. If the piezoelectric layer 17 is containing AlN and the resonance frequency is about 1.9 GHz, the thickness of the piezoelectric layer 17 may be about 2.2 μm.

Then, a metal film containing Ni is deposited on the substrate 12 including the piezoelectric layer 17, and then subjected to a patterning process by means of known photolithography and reactive ion etching (RIE), thereby forming the second electrode 18 on the piezoelectric layer 17 and above the first electrode 15, and forming the leading wiring line 19B electrically connected to the second electrode 18.

Further, an etching process is performed from the rear surface side 20 of the substrate 12 by means of Deep-RIE using a fluorine gas, and the plurality of cavities 2H, each of which has a sectional shape of a vertical side wall, are formed in the substrate 12 below at least a part of a region overlapping each of the first electrodes 15, the piezoelectric layer 17 and each of the second electrode 18. Then, the $SiO_2$ film 13a that corresponds to the lower layer of the first dielectric layer 13 remaining on the cavities 2H is removed by means of wet etching and reactive ion etching using an arsenide based gas, thereby completing the filter 11 according to the first embodiment (see FIG. 20).

As the result of evaluating the resonance characteristic of the thin film piezoelectric resonator formed by the above-described method by a vector network analyzer (HP8510C), excellent characteristics are obtained as follows. The resonance frequency is 2.0 GHz, an electromechanical coupling coefficient $K_t^2$ is 6.5%, and a Q value is 1000 at a resonance point while being 900 at an antiresonance point.

As such, in the filter 11 according to the first embodiment, the first dielectric layer 13 located below the first electrode 15 is formed to have the minimum necessary thickness, and the second dielectric layer 14 located below the edge portion 16 of the piezoelectric layer 17 is formed to have a larger thickness than the first dielectric layer 13. Therefore, at the time of forming the plurality of cavities 2H that pass through the substrate 12, it is possible to suppress the reduction of the film thickness occurring due to the large thickness of the dielectric layer located below the first electrode 15 and the reduction of the throughput occurring due to the increase of the etching time. Further, at the time of forming the piezoelectric layer 17, since it is possible to prevent the exposure of the surface of the substrate occurring due to the small thickness of the dielectric layer, a filter having high performance can be manufactured with high productivity.

SECOND EMBODIMENT (Thin Film Piezoelectric Resonator)

A thin film piezoelectric resonator 21 according to a second embodiment of the invention will be described with reference to FIGS. 21 to 30.

Figure 21:
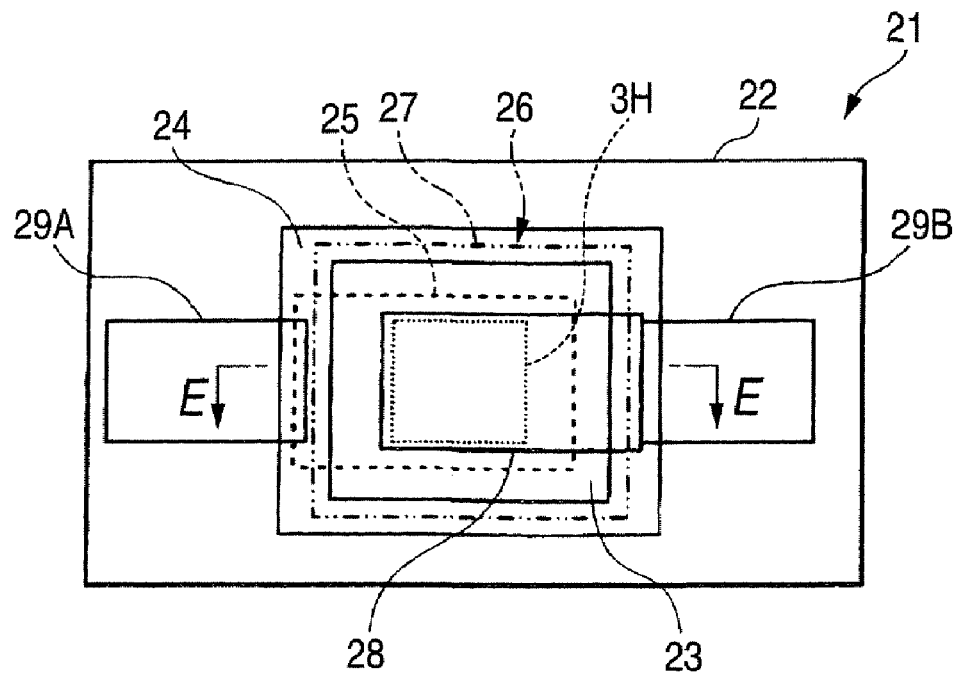
FIG. 21 is a plan view of a thin film piezoelectric resonator according to a second embodiment.
Figure 22:
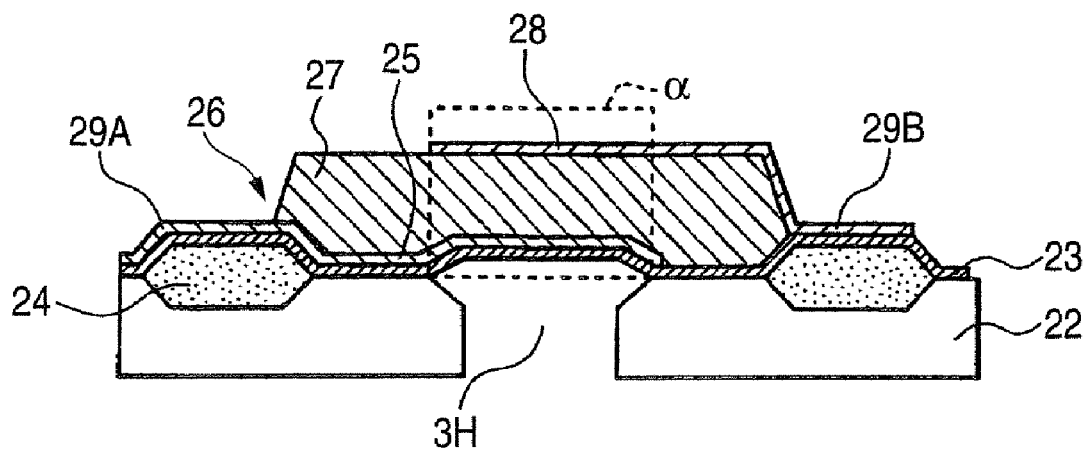
FIG. 22 is a cross-sectional view taken along the line E-E of FIG. 21.

As shown in FIGS. 21 and 22, the thin film piezoelectric resonator 21 includes a substrate 22 having a cavity 3H, a first dielectric layer 23 provided on the substrate 22 to cover the cavity 3H, a first electrode 25 provided on the first dielectric layer 23 and above the cavity 3H, a piezoelectric layer 27 provided on the first electrode 25, a second electrode 28 disposed on the piezoelectric layer 27 and above the first electrode 25, and a second dielectric layer 24 provided between the substrate 22 and the first dielectric layer 23 in peripheral regions of an excitation portion including an overlapping region α of the cavity 3H, the first electrode 25, the piezoelectric layer 27, and the second electrode 28. The piezoelectric layer 27 is disposed on the first dielectric layer 23 and extends to a region above at least a part of the second dielectric layer 24.

As the substrate 22, for example, a silicon (Si) substrate is practically used. The cavity 3H includes a hole that passes through the substrate 22 in the same planar shape from a front surface of the substrate 22 to a rear surface thereof. Further, a region occupied by the cavity 3H is accommodated in a region occupied by the first electrode 25. However, if the first electrode 25 may be held on the substrate 22, the region occupied by the cavity 3H may extend to the outside of the first electrode 25.

For example, the first dielectric layer 23 includes, for example, a dielectric layer having a single layer. However, the structure of the first dielectric layer 23 is not limited to the single-layered structure, and the first dielectric layer 23 may include a laminated structure in which a plurality of dielectric layers are laminated. If considering a processing margin and stability at the time of mass production, the first dielectric layer 23 is preferably formed of a silicon oxide film or a silicon nitride film. However, if having a dielectric characteristic, the forming material of the first dielectric layer 23 is not limited thereto, and the first dielectric layer 23 may be formed of an aluminum nitride film.

The second dielectric layer 24 is provided between the substrate 22 and the first dielectric layer 23 in peripheral regions of an excitation portion including an overlapping region α of the cavity 3H, the first electrode 25, the piezoelectric layer 27, and the second electrode 28. The second dielectric layer 24 may be formed of the same material as the first dielectric layer 23. An upper surface of the second dielectric layer 24 protrudes from the surface of the substrate 22. In addition, the second dielectric layer 24 is disposed within a restricted region in the peripheral region of the excitation portion.

The first electrode 25 is disposed on the first dielectric layer 23 and above the cavity 3H, and the region α of the first electrode 25 overlapping the cavity 3H is used as an effective lower electrode. A portion, which is formed of the same layer as the first electrode 25, integrated with the first electrode 25 (electrically connected to the first electrode 25), and provided in a region that does not overlap the cavity 3H, is used as a leading wiring line 29A. Each of the first electrode 25 and the leading wiring line 29A is formed by using, for example, a metal film containing aluminum (Al), an aluminum alloy, or the like, as a main body, and has a double structure in which a lower side of the piezoelectric layer 27 is an amorphous structure, in order to improve orientation of the piezoelectric layer 27.

The piezoelectric layer 27 is provided on the first electrode 25 to overlap the cavity 3H. The piezoelectric layer 17 is also provided on the first dielectric layer and extends to a region above at least a part of the second dielectric layer 24. That is, an edge portion 26 of the piezoelectric layer 27 is disposed on the first dielectric layer 23 including the second dielectric layer 24. Further, the edge portion 26 of the piezoelectric layer 27 indicates a processed end etched by patterning, in a case in which after a film containing, for example, aluminum nitride (AlN) is formed on the substrate 22 including a region on the first electrode 25, the film is patterned in a predetermined shape to form the piezoelectric layer 27.

The second electrode 28 is disposed on the piezoelectric layer 27 above the first electrode 25, and the region α of the second electrode 28 that overlaps the cavity 3H is used as an effective upper electrode. A portion, which is formed of the same layer as the second electrode 28, integrated with the second electrode 28 (electrically connected to the second electrode 28), and provided in a region that does not overlap the cavity 3H, is used as a leading wiring line 29B. Each of the second electrode 28 and the leading wiring line 29B can be formed by using molybdenum (Mo).

In the thin film piezoelectric resonator 21, the above-described excitation portion can vibrate by applying a voltage between the first electrode 25 and the second electrode 28. In addition, a resonance characteristic as the thin film piezoelectric resonator 21 can be obtained.

Next, a method of manufacturing the thin film piezoelectric resonator 21 will be described with reference to FIGS. 23 to 30. Each of the cross-sectional views shown in FIGS. 23 to 30 corresponds to a cross-sectional view taken along the line E-E of FIG. 21.

Figure 23:
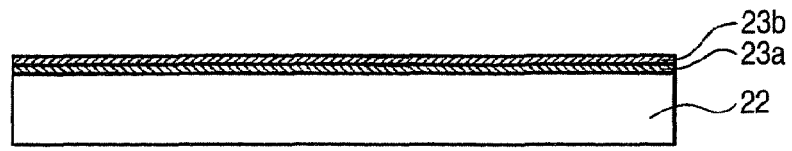
FIG. 23 is a schematic cross-sectional view illustrating a process of a method of manufacturing the thin film piezoelectric resonator according to the second embodiment.
Figure 24:
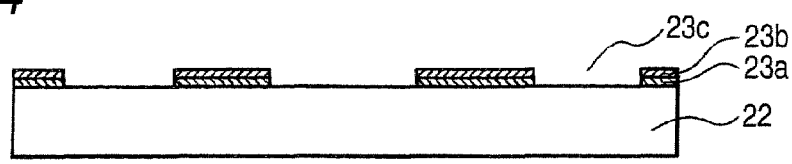
FIG. 24 is a schematic cross-sectional view illustrating a process of the method of manufacturing the thin film piezoelectric resonator according to the second embodiment.

First, a $SiO_2$ film 23a and a $Si_3N_4$ film 23b are formed on the substrate 22 formed of, for example, silicon (Si) respectively with a thickness of 50 nm by means of a thermal oxidation method (see FIG. 23). Then, a patterning process is performed on the formed $SiO_2$ film 23a and $Si_3N_4$ film 23b by means of known photolithography or reactive ion etching (RIE). Then, openings 23c for exposing the surface of the substrate 22 are formed in a portion where an excitation portion are formed and a peripheral region thereof (see FIG. 24).

Figure 25:
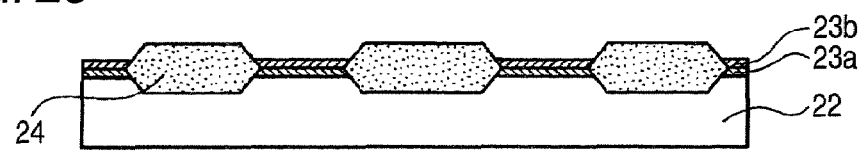
FIG. 25 is a schematic cross-sectional view illustrating a process of the method of manufacturing the thin film piezoelectric resonator according to the second embodiment.

Then, by means of dry oxidation, a $SiO_2$ film serving as the second dielectric layer 24 is deposited with a thickness of 150 nm in the openings 23c, thereby forming the second dielectric layer 24 (see FIG. 25).

Figure 26:
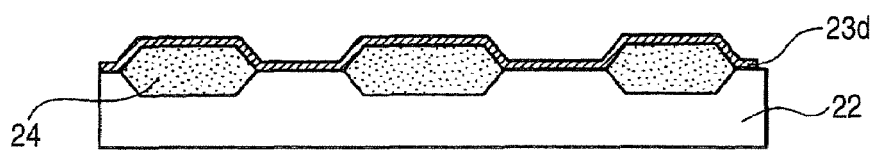
FIG. 26 is a schematic cross-sectional view illustrating a process of the method of manufacturing the thin film piezoelectric resonator according to the second embodiment.
Figure 27:
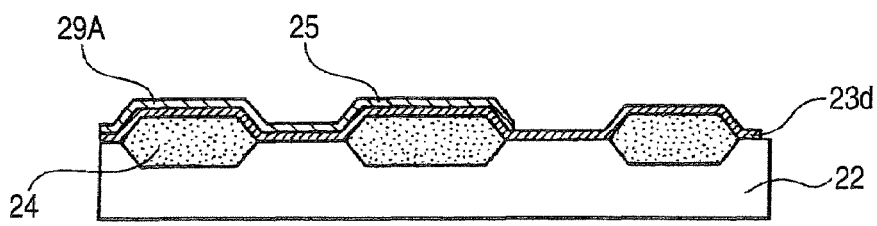
FIG. 27 is a schematic cross-sectional view illustrating a process of the method of manufacturing the thin film piezoelectric resonator according to the second embodiment.

Then, the formed $SiO_2$ film 23a and $Si_3N_4$ film 23b are completely removed by means of known photolithography or reactive ion etching (RIE), and then a $SiO_2$ film 23d becoming the first dielectric layer 23 is formed on the substrate 22 with a thickness of 100 nm by means of a CVD method (see FIG. 26).

Then, by means of a RF magnetron sputtering method, a metal film containing an amorphous Ta—Al alloy and Ni is deposited on the first dielectric layer 23. Then, the metal film is subjected to a patterning process by means of known photolithography and reactive ion etching (RIE), thereby forming the first electrode 25 and the leading wiring line 29A (see FIG. 27). Specifically, the patterning process of the metal film containing the amorphous Ta—Al alloy and Ni may be selectively performed by means of the RIE using a fluorine gas, such as $C_4F_8$ or the like, as an etching gas.

Figure 28:
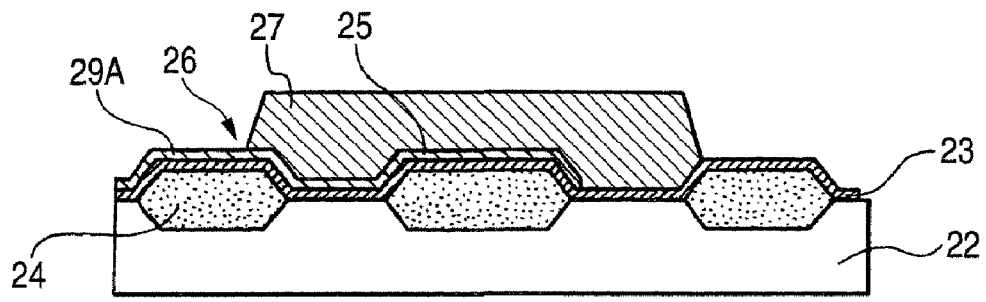
FIG. 28 is a schematic cross-sectional view illustrating a process of the method of manufacturing the thin film piezoelectric resonator according to the second embodiment.

Then, a metal film containing AlN is deposited on the substrate 22 including the first electrode 25 by means of a RF magnetron sputtering method, and subjected to a patterning process by means of known photolithography and reactive ion etching (RIE), thereby forming the piezoelectric layer 27 on the first electrode 25 such that the edge portion 26 extends to a region above at least a part of the second dielectric layer 24 (see FIG. 28). The thickness of the piezoelectric layer 27 depends on a resonance frequency. If the piezoelectric layer 27 contains AlN and the resonance frequency is about 1.9 GHz, the thickness of the piezoelectric layer 27 may be about 2.2 µm.

Figure 29:
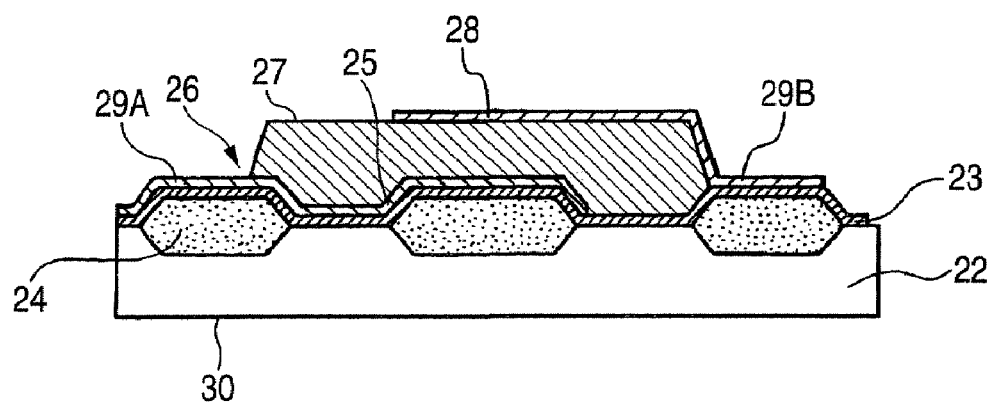
FIG. 29 is a schematic cross-sectional view illustrating a process of the method of manufacturing the thin film piezoelectric resonator according to the second embodiment.
Figure 30:
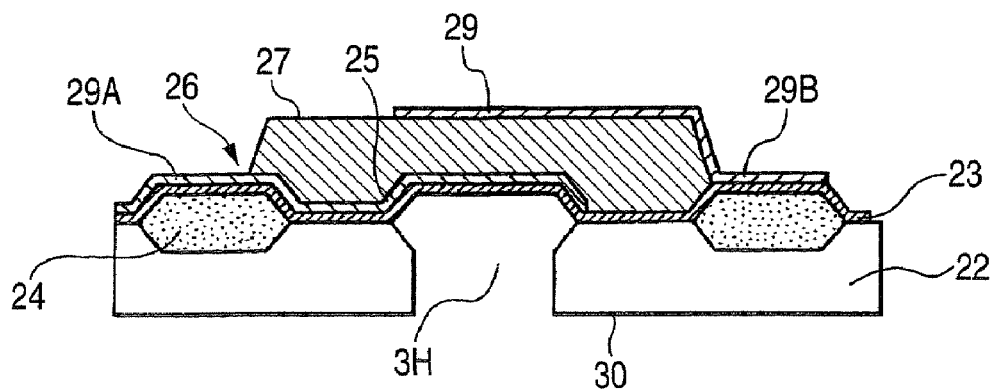
FIG. 30 is a schematic cross-sectional view illustrating a process of the method of manufacturing the thin film piezoelectric resonator according to the second embodiment.

Then, a metal film containing Ni is deposited on the substrate 22 including the piezoelectric layer 27 and then subjected to a patterning process by means of known photolithography and reactive ion etching (RIE), thereby forming the second electrode 28 on the piezoelectric layer 27 and above the first electrode 25, and forming the leading wiring line 29B electrically connected to the second electrode 28 (see FIG. 29).

Further, the substrate 22 at a region of the excitation portion is etched from the rear surface 30 of the substrate 22 by means of Deep-RIE using a fluorine gas, and the cavity 3H having a sectional shape of a vertical side wall is formed. Then, the second dielectric layer 24 remaining on the cavity 3H is removed by means of wet etching and reactive ion etching using an arsenide based gas, thereby completing the thin film piezoelectric resonator 21 according to the second embodiment (see FIG. 30).

As the result of evaluating the resonance characteristic of the thin film piezoelectric resonator formed by the above-described method by a vector network analyzer (HP8510C), excellent characteristics are obtained as follows. The resonance frequency is 2.0 GHz, an electromechanical coupling coefficient $K_r^2$ is 6.5%, and a Q value is 1000 at a resonance point while being 900 at an antiresonance point.

As such, in the thin film piezoelectric resonator 21 according to the second embodiment, the first dielectric layer 23 located below the first electrode 25 is formed to have the minimum necessary thickness, and the dielectric layer located below the edge portion 26 of the piezoelectric layer 27 is formed of a laminated structure including the first dielectric layer 23 and the second dielectric layer 24. Therefore, at the time of forming the cavity 3H that passes through the substrate 22, it is possible to suppress the reduction of the film thickness occurring due to the large thickness of the dielectric layer located below the first electrode 25 and the reduction of the throughput occurring due to the increase of the etching time. Further, at the time of forming the piezoelectric layer 27, since it is possible to prevent the exposure of the surface of the substrate occurring due to the small thickness of the dielectric layer, a thin film piezoelectric resonator having high performance can be manufactured with high productivity.

Furthermore, in the thin film piezoelectric resonator 21 according to the second embodiment of the invention, the second dielectric layer 24 and the first dielectric layer 23 are formed in advance in the portion where the resonance portion is formed, the first electrode 25, the piezoelectric layer 27, and the second electrode 28 are formed on the first dielectric layer 23 and above the second dielectric layer 24, and the second dielectric layer 24 located below the first electrode 25 is removed by etching. Therefore, when the etching process is performed from the rear surface side 30 of the substrate 22, even though a location of the cavity 3H deviates due to the variation in the manufacturing or the like, it does not affect the excitation portion, which accurately forms the excitation portion.

Preferably, the second dielectric layer 24 has a larger thickness than the first dielectric layer 23. Therefore, it is possible to prevent the exposure of the surface of the substrate occurring due to the small thickness of the dielectric layer at the time of forming the piezoelectric layer 27.

(Filter)

Next, the filter 41 according to the second embodiment of the invention will be described with respect to FIGS. 31 to 41. The thin film piezoelectric resonator according to the second embodiment of the invention is applied to the filter according to the second embodiment of the invention.

Figure 31:
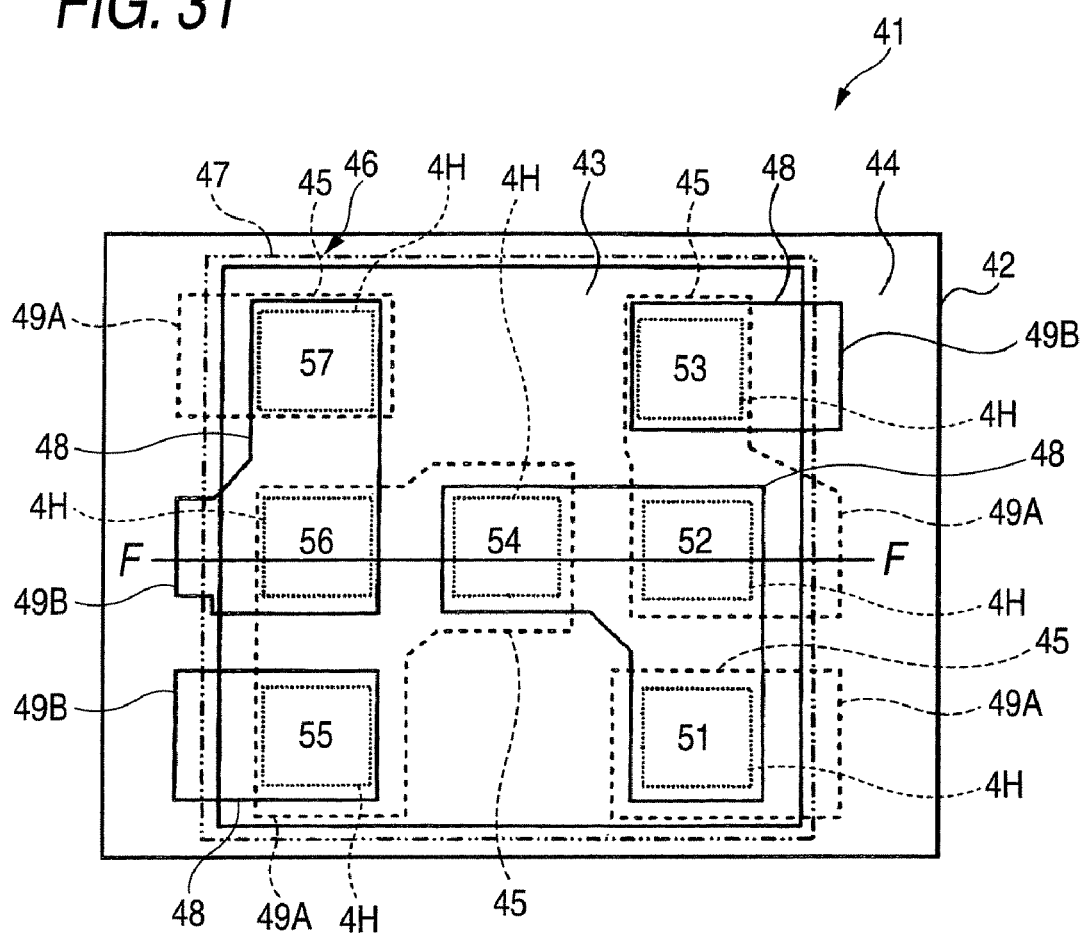
FIG. 31 is a plan view of a filter according to the second embodiment.
Figure 32:
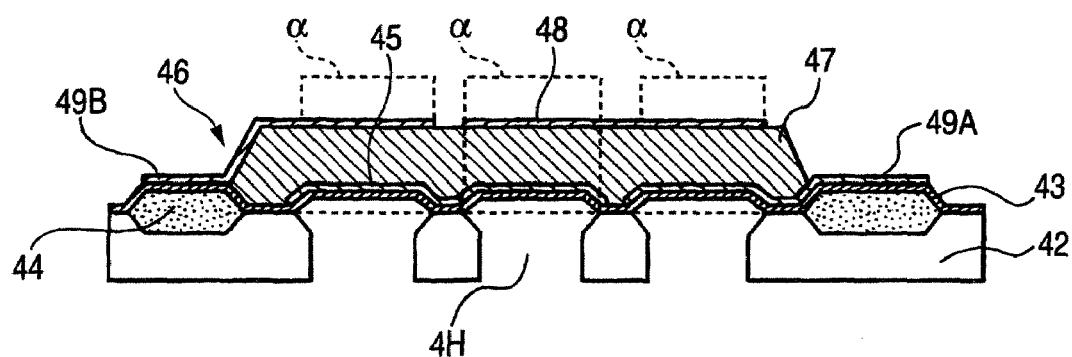
FIG. 32 is a cross-sectional view taken along the line F-F of FIG. 31.

As shown in FIGS. 31 to 32, the filter 41 includes a substrate 42 having a plurality of cavities 4H disposed to be spaced apart from each other, a first dielectric layer 43 provided on the substrate 42 to cover the plurality of cavities 4H, a plurality of first electrodes 45 provided on the first dielectric layer 43 and above the plurality of cavities 4H, respectively, a piezoelectric layer 47 provided on the plurality of first electrodes 45, a plurality of second electrodes 48 respectively provided on the plurality of first electrodes 43 with the piezoelectric layer 47, and a second dielectric layer 44 provided between the substrate 42 and the first dielectric layer 43 in peripheral regions of a plurality of excitation portions, each of which includes an overlapping region α of the cavity 4H, the first electrode 45, the piezoelectric layer 47, and the second electrode 48. The piezoelectric layer 47 is disposed on the first dielectric layer 43 to extend to a region above at least a part of the second dielectric layer 44.

As the substrate 42, for example, a silicon (Si) substrate is practically used. Each of the plurality of cavities 4H includes a hole that passes through the substrate 42 in the same planar shape from a front surface of the substrate 42 to a rear surface thereof. Further, a region occupied by the cavity 4H is accommodated in a region occupied by the first electrode 45. However, if the first electrode 45 may be held on the substrate 42, the region occupied by the cavity 4H may extend to the outside of the first electrode 45.

For example, the first dielectric layer 43 includes, for example, a dielectric layer having a single layer. However, the structure of the first dielectric layer 43 is not limited to the single-layered structure, and the first dielectric layer 43 may include a laminated structure in which a plurality of dielectric layers are laminated. If considering a processing margin and stability at the time of mass production, the first dielectric layer 43 is preferably formed of a silicon oxide film or a silicon nitride film. However, if having a dielectric characteristic, the forming material of the first dielectric layer 43 is not limited thereto, and the first dielectric layer 43 may be formed of an aluminum nitride film.

The second dielectric layer 44 is provided between the substrate 42 and the first dielectric layer 43 in peripheral regions of thin film piezoelectric resonators 51 to 57 having a plurality of excitation portions at predetermined gaps from the plurality of excitation portions 51 to 57. In this case, each of the plurality of excitation portions includes an overlapping region α of the cavity 4H, the first electrode 45, the piezoelectric layer 47, and the second electrode 48. The second dielectric layer 44 may be formed of the same material as the first dielectric layer 43. An upper surface of the second dielectric layer 44 protrudes from the surface of the substrate 42.

The first electrodes 45 are disposed on the first dielectric layer 43 and above the cavities 4H, respectively, and the region α of the first electrode 45 overlapping the cavity 4H is used as an effective lower electrode. A portion, which is formed of the same layer as the first electrode 45, integrated with the first electrode 45 (electrically connected to the first electrode 45), and provided in a region that does not overlap the cavity 4H, is used as a leading wiring line 49A. Each of the first electrode 45 and the leading wiring line 49A is formed by using, for example, a metal film containing aluminum (Al), an aluminum alloy, or the like, as a main body, and has a double structure in which a lower side of the piezoelectric layer 47 is an amorphous structure, in order to improve orientation of the piezoelectric layer 47.

The piezoelectric layer 47 is provided on the plurality of first electrodes 45 to overlap the cavities 4H. The piezoelectric layer 47 is also provided on the first dielectric layer 43 and extends to a region above at least a part of the second dielectric layer 44. That is, an edge portion 46 of the piezoelectric layer 47 is disposed on the first dielectric layer 43 including the second dielectric layer 44. Further, the edge portion 46 of the piezoelectric layer 47 indicates a processed end etched by patterning, in a case in which after a film containing, for example, aluminum nitride (AlN) is formed on the substrate 42 including a region on the first electrode 45, the film is patterned in a predetermined shape to form the piezoelectric layer 47.

The second electrodes 48 are disposed on the piezoelectric layer 47 and above the first electrodes 45, respectively, and the region α of the second electrode 48 that overlaps the cavity 4H is used as an effective upper electrode. A portion, which is formed of the same layer as the second electrode 48, integrated with the second electrode 48 (electrically connected to the second electrode 48), and provided in a region that does not overlap the cavity 4H, is used as a leading wiring line 49B. Each of the second electrode 48 and the leading wiring line 49B can be formed by using molybdenum (Mo).

In the filter 41, the above-described excitation portion can vibrate by applying a voltage between the first electrode 45 and the second electrode 48. In addition, a resonance characteristic as the filter 41 can be obtained.

Figure 33:
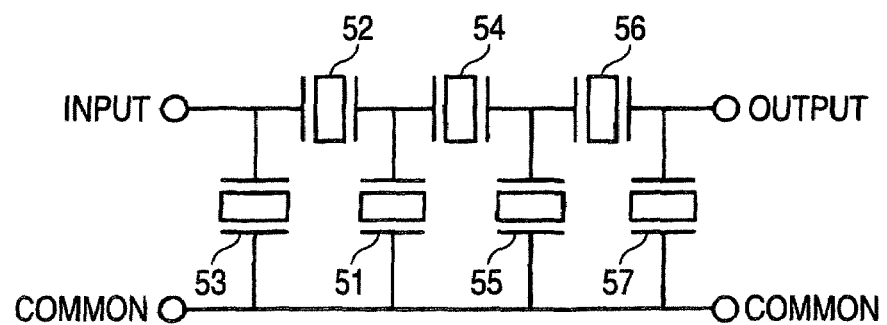
FIG. 33 is a conceptual view illustrating a circuit structure of a filter according to the second embodiment.

As shown in FIG. 33, the filter 41 has a structure in which three thin film piezoelectric resonators 52, 54, and 56 are electrically connected in series to one another, and four thin film piezoelectric resonators 51, 53, 55, and 57 are electrically connected parallel to one another. That is, the filter 41 includes the seven thin film piezoelectric resonators 51 to 57.

Next, a method of manufacturing the filter 41 will be described with reference to FIGS. 34 to 41. Each of the cross-sectional views shown in FIGS. 34 to 41 corresponds to a cross-sectional view taken along the line F-F of FIG. 31.

Figure 34:
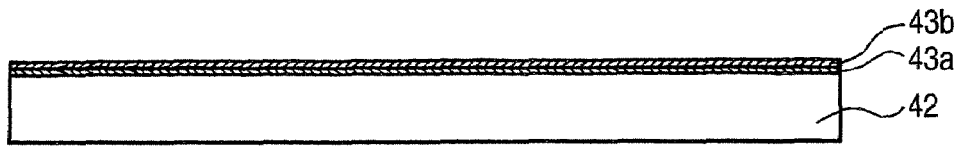
FIG. 34 is a schematic cross-sectional view illustrating a process of a method of manufacturing the filter according to the second embodiment.
Figure 35:
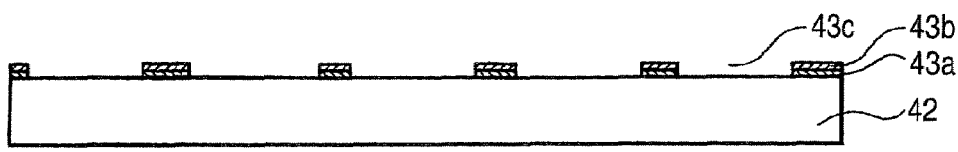
FIG. 35 is a schematic cross-sectional view illustrating a process of the method of manufacturing the filter according to the second embodiment.

First, a $SiO_2$ film 43a and a $Si_3N_4$ film 43b are formed on the substrate 42 formed of, for example, silicon (Si) respectively with a thickness of 50 nm by means of a thermal oxidation method (see FIG. 34). Then, a patterning process is performed on the formed $SiO_2$ film 43a and $Si_3N_4$ film 43b by means of known photolithography or reactive ion etching (RIE). Then, openings 43c for exposing the surface of the substrate 42 are formed in a portion where an excitation portion are formed and a peripheral region thereof (see FIG. 35).

Figure 36:
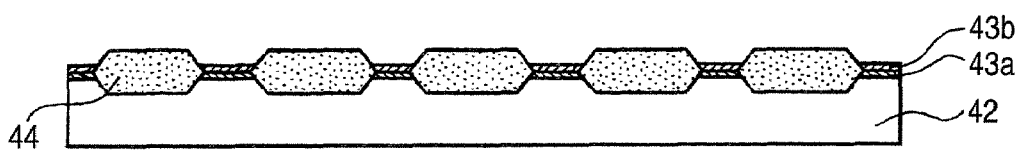
FIG. 36 is a schematic cross-sectional view illustrating a process of the method of manufacturing the filter according to the second embodiment.

Then, by means of dry oxidation, a $SiO_2$ film serving as the second dielectric layer 44 is deposited with a thickness of 150 nm in the openings 43c, thereby forming the second dielectric layer 44 (see FIG. 36).

Figure 37:
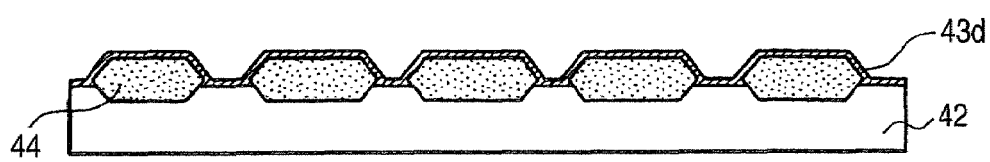
FIG. 37 is a schematic cross-sectional view illustrating a process of the method of manufacturing the filter according to the second embodiment.
Figure 38:
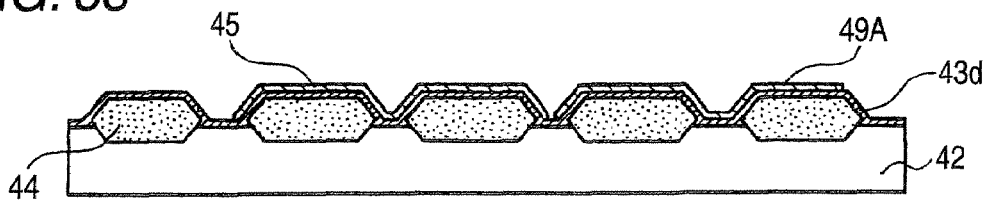
FIG. 38 is a schematic cross-sectional view illustrating a process of the method of manufacturing the filter according to the second embodiment.

Then, the formed $SiO_2$ film 43a and $Si_3N_4$ film 43b are completely removed by means of known photolithography or reactive ion etching (RIE), and then a $SiO_2$ film 43d becoming the first dielectric layer 43 is formed on the substrate 42 with a thickness of 100 nm by means of a CVD method (see FIG. 37).

Then, by means of a RF magnetron sputtering method, a metal film containing an amorphous Ta—Al alloy and Ni is deposited on the first dielectric layer 43. Then, the metal film is subjected to a patterning process by means of known photolithography and reactive ion etching (RIE), thereby forming the first electrode 45 and the leading wiring line 49A (see FIG. 38). Specifically, the patterning process of the metal film containing the amorphous Ta—Al alloy and Ni may be selectively performed by means of the RIE using a fluorine gas, such as $C_4F_8$ or the like, as an etching gas.

Figure 39:
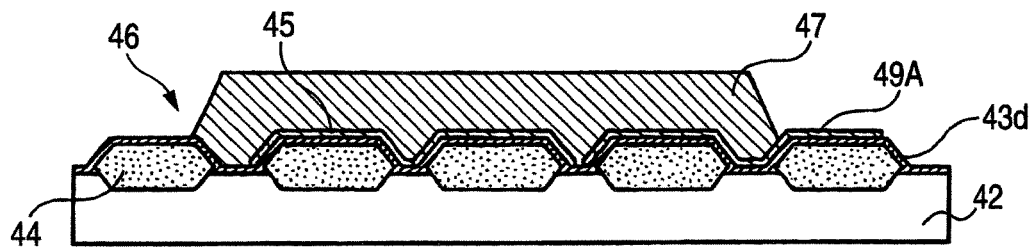
FIG. 39 is a schematic cross-sectional view illustrating a process of the method of manufacturing the filter according to the second embodiment.

Then, a metal film containing AlN is deposited on the substrate 42 including the first electrode 45 by means of a RF magnetron sputtering method, and subjected to a patterning process by means of known photolithography and reactive ion etching (RIE), thereby forming the piezoelectric layer 47 such that the edge portion 46 extends to a region above at least a part of the second dielectric layer 44 (see FIG. 39). The thickness of the piezoelectric layer 47 depends on a resonance frequency. If the piezoelectric layer 47 contains AlN and the resonance frequency is about 1.9 GHz, the thickness of the piezoelectric layer 47 may be about 2.2 μm.

Figure 40:
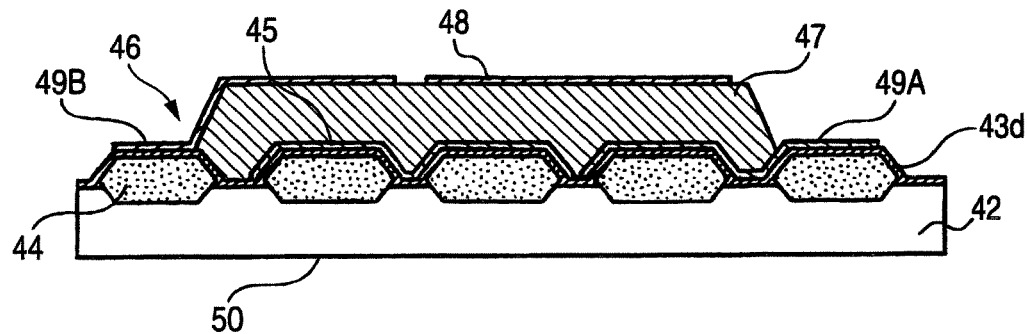
FIG. 40 is a schematic cross-sectional view illustrating a process of the method of manufacturing the filter according to the second embodiment.
Figure 41:
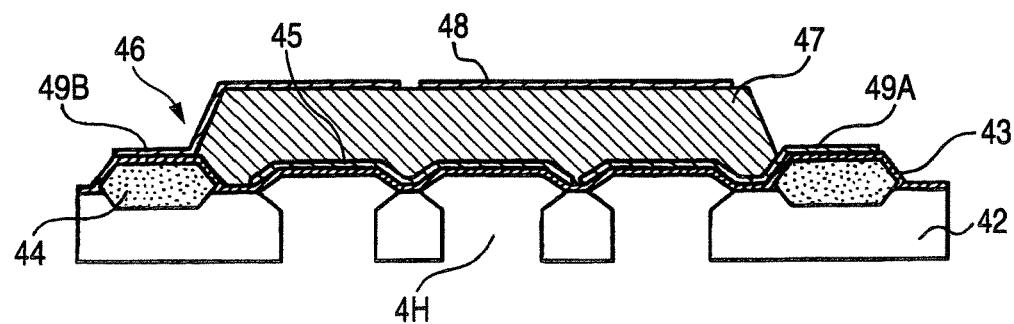
FIG. 41 is a schematic cross-sectional view illustrating a process of the method of manufacturing the filter according to the second embodiment.

Then, a metal film containing Ni is deposited on the substrate 42 including the piezoelectric layer 47 and then subjected to a patterning process by means of known photolithography and reactive ion etching (RIE), thereby forming the second electrode 48 on the piezoelectric layer 47 and above the first electrode 45, and forming the leading wiring line 49B electrically connected to the second electrode 48 (see FIG. 40).

Further, the substrate 42 at a region of the excitation portion is etched from the rear surface 50 of the substrate 42 by means of Deep-RIE using a fluorine gas, and the cavity 4H having a sectional shape of a vertical side wall is formed. Then, the second dielectric layer 44 remaining on the cavity 4H is removed by means of wet etching and reactive ion etching using an arsenide based gas, thereby completing the filter 41 according to the second embodiment (see FIG. 41).

As the result of evaluating the resonance characteristic of the thin film piezoelectric resonator formed by the above-described method by a vector network analyzer (HP8510C), excellent characteristics are obtained as follows. The resonance frequency is 2.0 GHz, an electromechanical coupling coefficient $K_r^2$ is 6.5%, and a Q value is 1000 at a resonance point while being 900 at an antiresonance point.

As such, in the filter 41 according to the second embodiment, the first dielectric layer 43 located below the first electrode 45 is formed to have the minimum necessary thickness, and the dielectric layer located below the edge portion 46 of the piezoelectric layer 47 is formed of a laminated structure including the first dielectric layer 43 and the second dielectric layer 44. Therefore, at the time of forming the cavity 4H that passes through the substrate 42, it is possible to suppress the reduction of the film thickness occurring due to the large thickness of the dielectric layer located below the first electrode 45 and the reduction of the throughput occurring due to the increase of the etching time. Further, at the time of forming the piezoelectric layer 47, since it is possible to prevent the exposure of the surface of the substrate occurring due to the small thickness of the dielectric layer, a thin film piezoelectric resonator having high performance can be manufactured with high productivity.

Furthermore, in the filter 41 according to the second embodiment of the invention, the second dielectric layer 44 and the first dielectric layer 43 are formed in advance in the portion where the resonance portion is formed, the first electrode 45, the piezoelectric layer 47, and the second electrode 48 are formed on the first dielectric layer 43 and above the second dielectric layer 44, and the second dielectric layer 44 located below the first electrode 45 is removed by etching. Therefore, when the etching process is performed from the rear surface side 50 of the substrate 42, even though a location of the cavity 4H deviates due to the variation in the manufacturing or the like, it does not affect the excitation portion, which accurately forms the excitation portion.

Preferably, the second dielectric layer 44 has a larger thickness than the first dielectric layer 43. Therefore, it is possible to prevent the exposure of the surface of the substrate occurring due to the small thickness of the dielectric layer at the time of forming the piezoelectric layer 47.

What is claimed is:

1. A thin film piezoelectric resonator comprising:
    a substrate having a cavity;
    a first dielectric layer provided on the substrate to cover the cavity;
    a second dielectric layer provided on the substrate and disposed in a peripheral region of the cavity, and having a thickness larger than the first dielectric layer;
    a first electrode provided on the first dielectric layer and above the cavity;
    a piezoelectric layer provided on the first electrode and disposed to extend to a region on the second dielectric layer; and
    a second electrode provided on the piezoelectric layer and above the first electrode.

2. The resonator according to claim 1, wherein the first dielectric layer includes a first layer provided on the substrate except on the cavity, and a second layer provided on the first layer and the cavity.

3. The resonator according to claim 1, wherein an upper surface of the second dielectric layer protrudes from the surface of the substrate.

4. The resonator according to claim 1, wherein the second dielectric layer is disposed within a restricted region in the peripheral region of the cavity.

5. A thin film piezoelectric resonator comprising:
    a substrate having a cavity;
    a first dielectric layer provided on the substrate to cover the cavity;
    a first electrode provided on the first dielectric layer and above the cavity;
    a piezoelectric layer provided on the first electrode;
    a second electrode provided on the piezoelectric layer and above the first electrode; and
    a second dielectric layer provided between the substrate and the first dielectric layer in a peripheral region of an excitation portion including an overlapping region of the cavity, the first electrode, the piezoelectric layer, and the second electrode,
    wherein the piezoelectric layer is disposed on the first dielectric layer and extends to a region on at least a part of the second dielectric layer.

6. The resonator according to claim 5, wherein the second dielectric layer has a thickness larger than the first dielectric layer.

7. The resonator according to claim 5, wherein an upper surface of the second dielectric layer protrudes from the surface of the substrate.

8. The resonator according to claim 5, wherein the second dielectric layer is disposed within a restricted region in the peripheral region of the excitation portion.

9. A filter comprising:
a substrate including a plurality of cavities disposed to be spaced apart from one another;
a first dielectric layer provided on the substrate to cover the plurality of cavities;
a second dielectric layer provided on the substrate and disposed in peripheral regions of the plurality of cavities, and having a thickness larger than the first dielectric layer;
a plurality of first electrodes provided on the first dielectric layer and above the plurality of cavities, respectively;
a piezoelectric layer provided on the plurality of first electrodes and disposed to extend to a region on at least a part of the second dielectric layer; and
a plurality of second electrodes provided on the piezoelectric layer and above the plurality of first electrodes, respectively.

10. The filter according to claim 9, wherein the first dielectric layer includes a first layer provided on the substrate except on the cavity, and a second layer provided on the first layer and the cavity.

11. The filter according to claim 9, wherein an upper surface of the second dielectric layer protrudes from the surface of the substrate.

12. A filter comprising:
a substrate including a plurality of cavities disposed to be spaced apart from one another;
a first dielectric layer provided on the substrate to cover the plurality of cavities;
a plurality of first electrodes provided on the first dielectric layer and above the plurality of cavities, respectively;
a piezoelectric layer provided on the plurality of first electrodes;
a plurality of second electrodes provided on the piezoelectric layer and above the plurality of first electrodes, respectively; and
a second dielectric layer provided between the substrate and the first dielectric layer in peripheral regions of a plurality of excitation portions, each of which includes an overlapping region of the cavity, the first electrode, the piezoelectric layer, and the second electrode,
wherein the piezoelectric layer is disposed on the first dielectric layer and extends to a region on at least a part of the second dielectric layer.

13. The filter according to claim 12, wherein the second dielectric layer has a thickness larger than the first dielectric layer.

14. The filter according to claim 12, wherein an upper surface of the second dielectric layer protrudes from the surface of the substrate.

* * * * *